(12) United States Patent
Bai

(10) Patent No.: US 8,976,893 B2
(45) Date of Patent: Mar. 10, 2015

(54) PREDISTORTION ACCORDING TO AN ARTIFICIAL NEURAL NETWORK (ANN)-BASED MODEL

(75) Inventor: Chunlong Bai, Kanata (CA)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 307 days.

(21) Appl. No.: 13/547,883

(22) Filed: Jul. 12, 2012

(65) Prior Publication Data

US 2013/0343483 A1    Dec. 26, 2013

Related U.S. Application Data

(60) Provisional application No. 61/663,905, filed on Jun. 25, 2012.

(51) Int. Cl.
    *H04K 1/02*          (2006.01)
    *H04L 25/03*        (2006.01)
    *H04L 25/49*        (2006.01)

(52) U.S. Cl.
    USPC ........................................... 375/296; 375/297

(58) Field of Classification Search
    USPC ................................................. 375/295, 297
    See application file for complete search history.

(56) References Cited

U.S. PATENT DOCUMENTS

| | | | |
|---|---|---|---|
| 6,504,425 B1 | 1/2003 | Kim | |
| 7,577,211 B2 | 8/2009 | Braithwaite | |
| 2003/0223508 A1 | 12/2003 | Ding | |
| 2004/0179629 A1 | 9/2004 | Song | |
| 2007/0075770 A1 | 4/2007 | Long | |
| 2009/0237158 A1 | 9/2009 | Hehn | |
| 2012/0119832 A1 | 5/2012 | Bai et al. | |

FOREIGN PATENT DOCUMENTS

EP      2146474 A1      1/2010

OTHER PUBLICATIONS

Liu et al., Dynamic Behavioral Modeling of 3G Power Amplifiers Using Real-Valued Time-Delay Neural Networks, IEEE Transactions on Mircrowave Theory and Techniques, vol. 52, No. 3, Mar. 2004.*
Mkadem et al., IEEE, Behavioral Modeling and Digital Predistortion of Power Amplifiers with Memory using Two hidden Layers Artificial Neural Networks, 2010.*

(Continued)

*Primary Examiner* — Freshteh N Aghdam
(74) *Attorney, Agent, or Firm* — Coats & Bennett, P.L.L.C.

(57) ABSTRACT

Embodiments include a method for predistorting an input signal at a predistorter to compensate for distortion introduced by a non-linear electronic device operating on the input signal to produce an output signal. The method entails generating first and second signal samples for each of a plurality of sampling time instances. The first and second signal samples represent the input and output signals, and are spaced at unit-delay intervals. The method further entails calculating, from the first and second signal samples, parameters for an ANN-based model. The ANN-based model includes a tapped delay line configured to dynamically model memory effects of the distortion introduced by the device, or of the response of the predistorter, with a multi-unit delay interval between at least one pair of adjacent delays. The method also includes predistorting the input signal according to the ANN-based model, to produce a predistorted input signal for input to the device.

18 Claims, 10 Drawing Sheets

(56) References Cited

OTHER PUBLICATIONS

Wan, G., et al., "Shortwave Memory Power Amplifier Linearization Based on Tanh Neural Network Predistorter", 2009 International Conference on Innovation Management, IEEE, Dec. 8, 2009, pp. 63-66, Piscataway, NJ, USA, XP031610794.

Rawat, M., et al., "A Mutual Distortion and Impairment Compensator for Wideband Direct-Conversion Transmitters Using Neural Networks", IEEE Transactions on Broadcasting, IEEE Service Center, May 18, 2012, pp. 168-177, vol. 58, No. 2, Piscataway, NJ, USA, XP011444598.

Ahmed, A. et al, "Efficient PA Modeling Using Neural Network and Measurement Setup for Memory Effect Characterization in the Power Device", 2005 IEEE MTT-S International Microwave Symposium, Jun. 12, 2005, pp. 473-476, IEEE, XP010844771.

Zhang, Q.J. et al. "Artificial Neural Networks for RF and Microwave Design: From Theory to Practice." IEEE Transactions on Microwave Theory and Techniques, Apr. 2003, pp. 1-16, vol. 51, Issue 4.

Mkadem, F. et al. "Physically Inspired Neural Network Model for RF Power Amplifier Behavioral Modeling and Digital Predistortion." IEEE Transactions on Microwave Theory and Techniques, Apr. 2011, pp. 913-923, vol. 59, No. 4.

Khurram, M. U. et al. "An Extended Nonlinear Transform Domain Adaptive Filter." IEEE Signal Processing Workshop on Higher-Order Statistics, South Lake Tahoe, CA, USA, Jun. 7-9, 1993.

Li, H. et al. "Nonlinear Least Squares Lattice Algorithm for Identifying the Power Amplifier with Memory Effects." IEEE 63rd Vehicular Technology Conference, Melbourne, Australia, May 7-10, 2006.

Ren, K. et al. "Identification of Memory Polynomial Nonlinear Models for RF Power Amplifiers with a Systolic Array Based QRD-RLS Algorithm." Asia-Pacific Microwave Conference, Macau, China, Dec. 16-20, 2008.

Ahmed, A. et al. "Power Amplifier Linearization Using Memory Polynomial Predistorter with Non-uniform Delay Taps." IEEE MTT-S International Microwave Symposium Digest, vol. 3, Jun. 6-11, 2004.

Liu, T. et al. "Dynamic Behavioral Modeling of 3G Power Amplifiers Using Real-Valued Time-Delay Neural Networks." IEEE Transactions on Microwave Theory and Techniques, Mar. 2004, pp. 1025-1033, vol. 52, No. 3.

Rawat, M. "Adaptive Digital Predistortion of Wireless Power Amplifiers/Transmitters Using Dynamic Real-Valued Focus Time-Delay Line Neural Networks." IEEE Transactions on Microwave Theory and Techniques, Jan. 2010, pp. 95-104, vol. 58, No. 1.

Ahmed, A., et al., "Power Amplifier Modeling Using Memory Polynomial with Non-uniform Delay Taps", 34th European Microwave Conference, 2004, Oct. 14, 2004, pp. 1457-1460, Amsterdam, Netherlands, XP031996107.

\* cited by examiner

PREDISTORTION ACCORDING TO AN ARTIFICIAL NEURAL NETWORK (ANN)-BASED MODEL

TECHNICAL FIELD

The present invention relates generally to predistorting an input signal to a non-linear electronic device and, more particularly, to predistorting the input signal according to an artificial neural network (ANN)-based model that dynamically models memory effects with a multi-unit delay interval between at least one pair of adjacent delays in a tapped delay line.

BACKGROUND

The design of radio-frequency power amplifiers (PAs) for communications applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits a nonlinear response and memory effects.

One way to improve a power amplifier's efficiency and its overall linearity is to digitally predistort the input to the power amplifier to compensate for the distortion introduced by the power amplifier. In effect, the input signal is adjusted in anticipation of the distortion to be introduced by the power amplifier, so that the output signal is largely free of distortion products. Generally, digital predistortion is applied to the signal at baseband frequencies, i.e., before the signal is upconverted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

Some techniques realize these advantages by accounting for memory effects, i.e., the dependence of an output signal on prior states of the input signal as well as on the present state. One problem associated with adding memory effects to conventional distortion models, however, is the extra instability added to the model parameter evaluation process due to the introduction of the memory model terms in the model. A fundamental source of this added instability is the high correlation among the data samples used in the parameter evaluations.

SUMMARY

One or more embodiments herein employ an artificial neural network (ANN)-based model that advantageously models memory effects for predistortion in a way that increases the stability of the model parameter evaluation process, as compared to known approaches. The ANN-based model includes a tapped delay line configured to model these memory effects with a multi-unit delay interval between at least one pair of adjacent delays. The multi-unit delay interval decreases correlation between successive data samples, as compared to a unit delay interval. This in turn increases the stability of the model parameter evaluation process.

More particularly, one or more embodiments herein include a method for predistorting an input signal at a predistorter to compensate for distortion introduced by a non-linear electronic device (e.g., a power amplifier) operating on the input signal to produce an output signal. The method entails generating first and second signal samples for each of a plurality of sampling time instances. The first and second signal samples represent the input and output signals, respectively, and are spaced at unit-delay intervals. Each of the second signal samples corresponds in time to one of the first signal samples.

The method further entails calculating, from the first and second signal samples, parameters for an ANN-based model. In at least some embodiments, these parameters include at least one of weighting parameters and bias parameters for artificial neurons in the ANN-based model. Regardless, the ANN-based model includes a tapped delay line and is configured to dynamically model memory effects of the distortion introduced by the electronic device, or of the response of the predistorter, with a multi-unit delay interval between at least one pair of adjacent delays. The method also includes predistorting the input signal according to the ANN-based model, to produce a predistorted input signal for input to the electronic device.

In some embodiments, the ANN-based model is configured to dynamically model memory effects of the response of the predistorter. In this case, an input to the ANN-based model corresponds to the second signal samples and an output of the ANN-based model corresponds to the first signal samples. Moreover, calculating the parameters from the first and second signal samples comprises directly estimating the parameters from the first and second signal samples.

In other embodiments, by contrast, the ANN-based model is configured to dynamically model memory effects of the distortion introduced by the electronic device. In this case, an input to the ANN-based model corresponds to the first signal samples and an output of the ANN-based model corresponds to the second signal samples.

In at least one embodiment, the multi-unit delay interval between the at least one pair of adjacent delays differs from a delay interval between at least one other pair of adjacent delays. That is, the delay intervals between different pairs of delays in the tapped delay line are non-uniform. In other embodiments, though, the ANN-based model models the memory effects with the same multi-unit delay interval between each pair of adjacent delays, i.e., the delay intervals between different pairs of delays in the tapped delay line are uniform.

Regardless, the tapped delay line in one or more embodiments is a variable tapped delay line. In one such embodiment, for example, processing at the predistortion circuit further includes dynamically selecting the multi-unit delay interval between the at least one pair of adjacent delays from a plurality of candidate multi-unit intervals, based on the ratio of the sampling rate of the first and second samples to a nominal baseband bandwidth of the input signal. In embodiments where the delay intervals between pairs of adjacent delays are uniform, this amounts to dynamically selecting the same multi-unit delay interval.

With configurable delay intervals as described above, the ANN-based model according to one or more embodiments herein dynamically models those of the memory effects that occur over a first term with a first delay interval between each of one or more first pairs of adjacent delays, and dynamically models those of the memory effects that occur over a second term with a second delay interval between each of one or more second pairs of adjacent delays. In one embodiment, for example, the first term is shorter than the second term, the one or more second pairs of delays follow the one or more first pairs of delays in the tapped delay line, the first delay interval comprises a unit delay interval, and the second delay interval comprises a multi-unit delay interval.

Embodiments herein also include a corresponding apparatus configured to perform the processing above. In particular, embodiments herein include a predistortion circuit that includes a sampling circuit, a distortion modeling circuit, and a predistorter configured to operate as described above.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
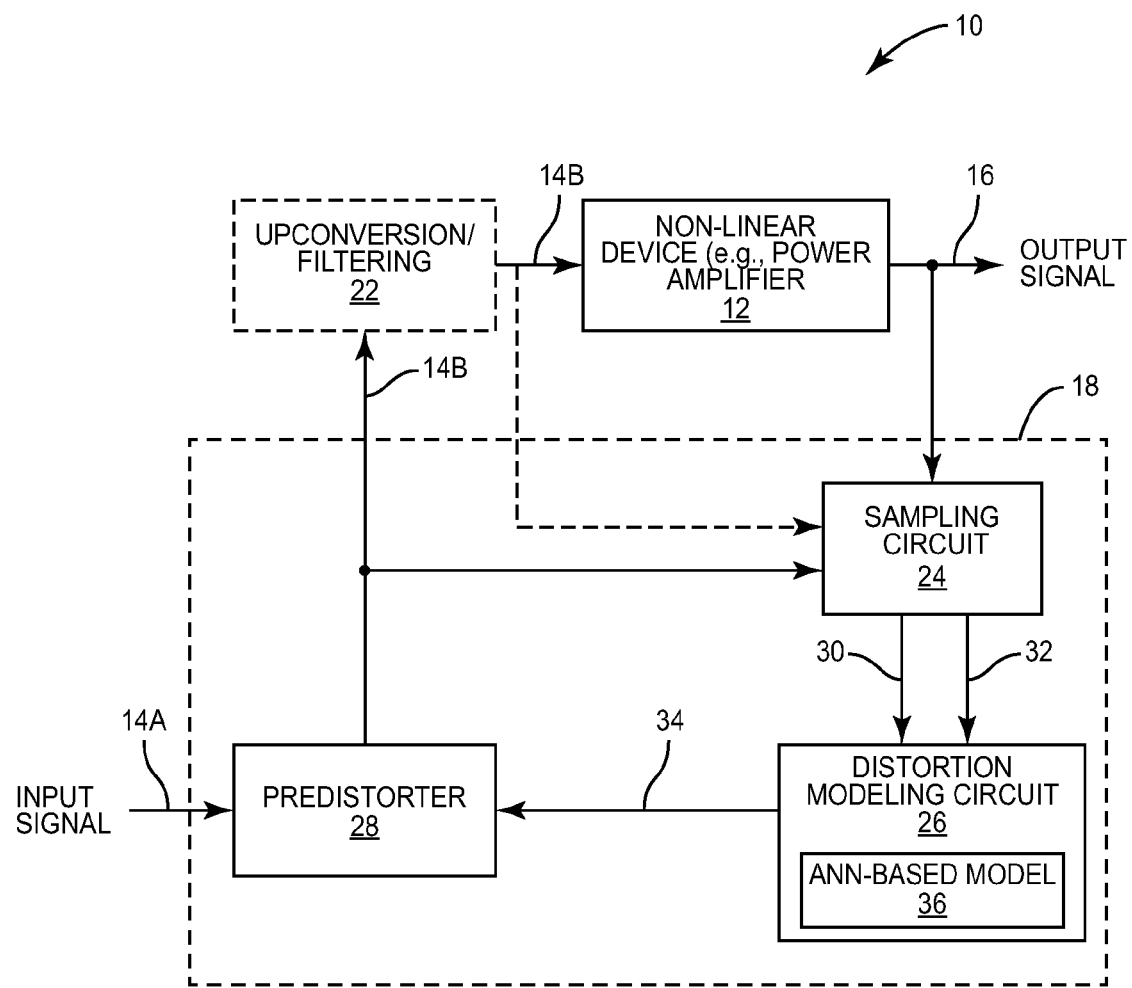
FIG. 1 is a block diagram of a predistortion circuit configured according to one or more embodiments.

FIG. 1 illustrates a predistortion system 10 that includes a non-linear electronic device 12, such as a power amplifier in a wireless transmitter circuit of a base station or mobile device. The device 12 introduces distortion to the signal 14 on which it operates and thereby threatens the integrity of the device's output signal 16. To address this, the system 10 also includes a predistortion circuit 18. The predistortion circuit 18 predistorts the input signal 14, in order to compensate for the distortion that will be introduced by the device 12, and then inputs the resulting predistorted input signal 14 into the device 12 (as referred to herein, input signal 14A denotes the input signal 14 before it is predistorted, while input signal 14B denotes the input signal 14 after it is predistorted). This way, when the device 12 introduces distortion to the predistorted input signal 14B, the output signal 16 will contain fewer distortion products than without the predistortion circuit 18.

In at least some embodiments, the predistortion system 10 applies this predistortion to the input signal 14A at a lower frequency (e.g., at a baseband frequency) and then upconverts the resulting predistorted input signal 14B to a higher frequency (e.g., a radio frequency) before inputting that signal 14B to the device 12. In this case, therefore, the predistortion system 10 includes an upconversion/filtering circuit 22 configured to upconvert the predistorted input signal 14A. This upconversion in frequency is of course reflected in the output signal 16 as well. Thus, as explained below, because the predistortion circuit 18 determines the predistortion to apply based on the output signal 16, the predistortion circuit 18 in this case may include a corresponding downconverter (not shown) in order to shift the output signal 16 back to the lower frequency.

Moreover, in embodiments where the device 12 comprises a power amplifier, the predistortion circuit 18 may include an attenuator (not shown) in order to scale the output signal 16 by the inverse of the net linear gain G that results from the combination of the predistortion circuit 18 and the power amplifier. Scaling the output signal 16 by the inverse of G permits the non-linearities introduced by the power amplifier to be analysed independently of its gain.

Irrespective of these variations, though, the predistortion circuit 18 in FIG. 1 includes a sampling circuit 24, a distortion modelling circuit 26, and a predistorter 28. The sampling circuit 24 (which in some embodiments includes a downconverter and/or an attenuator as discussed above) is configured to generate samples of the input signal 14 and the output signal 16 for each of a plurality of sampling time instances. As used herein, the input signal samples will be referred to as first signal samples 30 that represent the input signal 14, and the output signal samples will be referred to as second signal samples 32 that represent the output signal 16. In embodiments that upconvert the predistorted input signal 14B, the sampling circuit 24 may generate the first signal samples 30 either before or after upconversion of the predistorted input signal 14B. Regardless, the first signal samples 30 are spaced at unit-delay intervals from the second signal samples 32, meaning that the first signal samples 30 are delayed by one sampling time instance relative to the second signal samples 32. Each of the second signal samples 32 therefore corresponds in time to one of the first signal samples 30.

From these first and second signal samples 30, 32, the distortion modelling circuit 26 calculates parameters for an artificial neural network (ANN)-based model 36 that models either (1) the distortion introduced by the device 12; or (2) the response of the predistorter 28 to that distortion. Based on this model 36, the distortion modelling circuit 26 sends a control signal 34 to the predistorter 28 for configuring the predistorter 28 to compensate for or otherwise effectively reverse the distortion introduced by the device 12. In at least some embodiments, for example, the control signal 34 indicates adjustments to the parameters of a model or non-linear transfer function maintained by the predistorter 28 for modelling the predistorter's response. The model maintained by the predistorter 28 may be a replica of the ANN-based model 36 maintained by the distortion modelling circuit 36. Regardless, the predistorter 28 predistorts the input signal 14A according to the ANN-based model 36, to produce the predistorted input signal 14B for input to the device 12.

The ANN-based model 36 functionally comprises an interconnected group of signal processing elements (referred to as artificial neurons, ANs). As explained in more detail below, the distortion modelling circuit 26 configures each of a plurality of artificial neurons (e.g., each artificial neuron forming a hidden layer or an output layer in a multilayer perceptron structure) for signal processing according to a plurality of weighting parameters (i.e., coefficients or factors) and a bias parameter. The ANN-based model 36 also includes a tapped delay line for dynamically modelling memory effects of the device's distortion or of the predistorter's response. Notably, the ANN-based model 36 models these memory effects with a multi-unit delay interval between at least one pair of delays that are adjacent in the tapped delay line. This means that the successive data samples corresponding to the adjacent delays are separated by multiple sampling time instances and therefore have less correlation than if they were separated by only a single sampling time instance. This decreased correlation advantageously increases the stability with which the distortion modelling circuit 26 calculates the parameters of the ANN-based model (e.g., the weighting parameters and bias parameter for each of a plurality of artificial neurons).

In some embodiments, increasing parameter calculation stability in this way nonetheless degrades the ANN-based model's performance, e.g., as manifested in terms of normalized mean square error (NMSE) between the actual output of the model 36 and the desired output of the model 36. In this case, therefore, the determination of the multi-unit delay interval between the at least one pair of adjacent delays is based on the trade-off between parameter calculation stability and model performance.

Regardless, in at least some embodiments, the delay intervals between different pairs of delays in the tapped delay line are uniform, meaning that the ANN-based model 36 models the memory effects with the same multi-unit delay interval between each pair of adjacent delays. In other embodiments, by contrast, the delay intervals between different pairs of delays in the tapped delay line are non-uniform. In this case, therefore, the multi-unit delay interval between one pair of adjacent delays may differ from the delay interval between a different pair of adjacent delays. The delay interval between this different pair of adjacent delays, for instance, may be a unit delay interval rather than a multi-unit delay interval or may be a different multi-unit delay interval.

With the number of unit delay intervals between adjacent delays configurable in this way, the ANN-based model 36 in some embodiments models memory effects over one term (e.g., a short term) with a particular delay interval (e.g., a unit delay interval) between each of one or more pairs of adjacent delays, and models memory effects over another term (e.g., a long term) with a different delay interval (e.g., a multi-unit delay interval) between each of one or more other pairs of adjacent delays. For example, the tapped delay line may have one or more pairs of adjacent delays with unit delay intervals therebetween, followed by one or more pairs of adjacent delays with multi-unit delay intervals therebetween. This approach facilitates the fine-resolution modelling of short-term memory effects, with coarser modelling of longer-term effects. Other configurations of non-uniform delay intervals are also possible.

Irrespective of whether or not the delay intervals are uniform across different pairs of adjacent delays in the tapped delay line, the distortion modelling circuit 26 in at least some embodiments is configured to dynamically select one or more of those delay intervals such that the tapped delay line is variable. Dynamic selection of delay intervals in this way proves advantageous, for example, in embodiments where the system 10 is configured to operate with different input signal 14A bandwidths at different times. Indeed, given a certain sampling rate, changing the input signal 14A bandwidth causes the ratio between the sampling rate and the input signal 14A bandwidth to change. This in turn changes the degree of correlation among successive samples of the input 40 to the ANN-based model 36. The distortion modelling circuit 26 in these embodiments therefore dynamically selects one or more delay intervals (e.g., a multi-unit delay interval between at least one pair of adjacent delays) responsive to adjustments in the input signal 14A bandwidth, e.g., in order to achieve a certain balance between the stability with which the ANN-based model parameters may be calculated and the performance of the ANN-based model 36.

Figure 2:
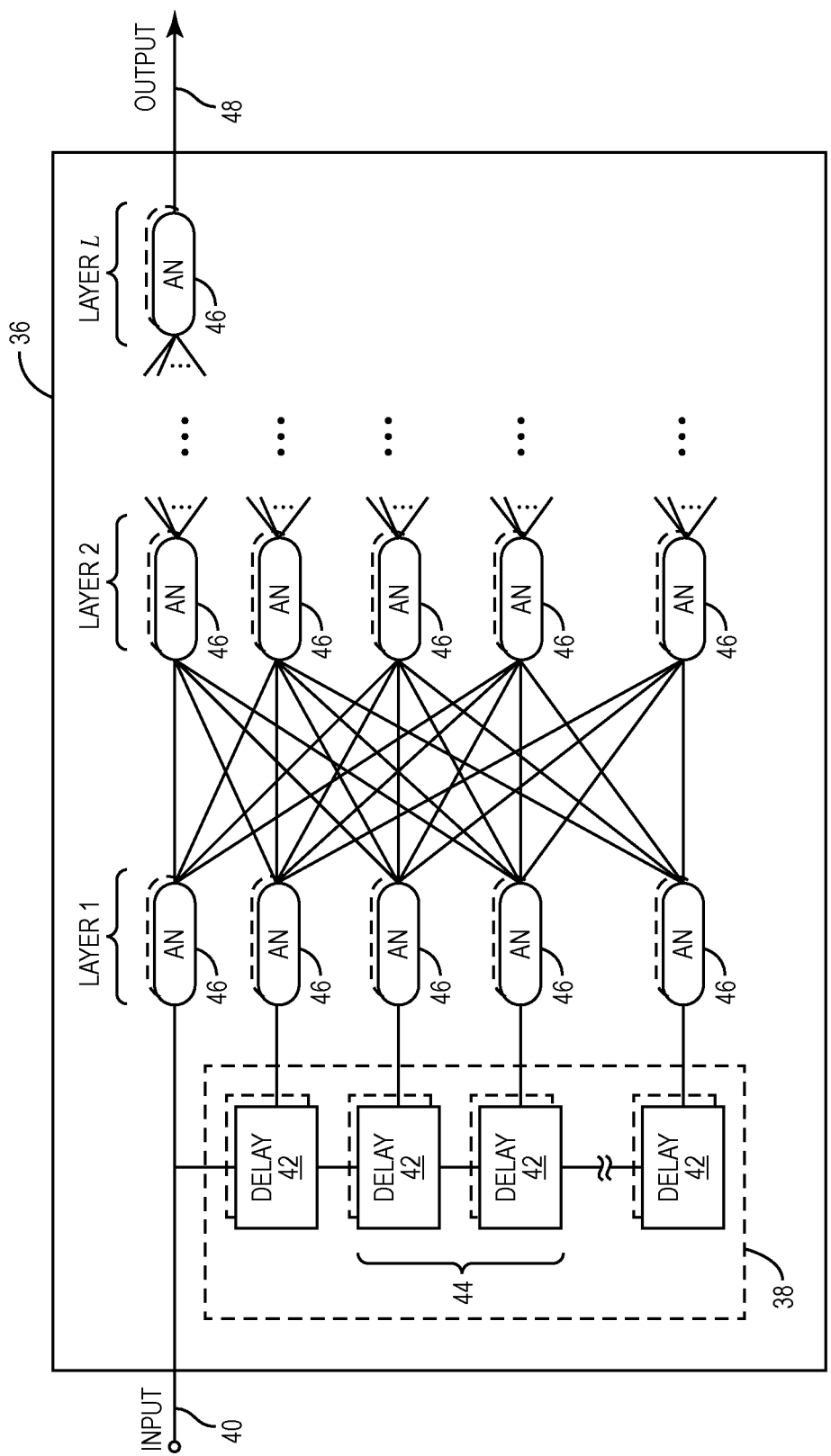
FIG. 2 is a functional block diagram of an artificial neural network (ANN)-based model used by the predistortion circuit of FIG. 1 according to one or more embodiments where the ANN-based model has a multilayer perceptron structure.

FIG. 2 illustrates additional details of the ANN-based model 36 according to one or more embodiments where the model 36 has a multilayer perceptron structure. As shown in FIG. 2, the ANN-based model 36 includes a tapped delay line 38 that samples an input 40 to the model 36 at delays 42 in order to generate different delayed versions or samples of that input 40. At least one pair of delays 42 that are adjacent in the tapped delay line 38, for example pair 44, are separated by a multi-unit delay interval, meaning that the samples from that pair 44 of delays 42 are separated by multiple sampling time instances. Three or more layers L of interconnected artificial neurons (ANs) 46 process the samples generated from the tapped delay line 38 according to the parameters of the model 36, namely according to the weighting parameters and the bias parameter defined for each of a plurality of artificial neurons 46. This processing produces an output 48 of the model 36.

Note that in at least some embodiments the input 40 and output 48 of the model 36 each have multiple components, such as an in-phase component and a quadrature component in a rectangular representation or a magnitude component and a phase component in a polar representation. In this case, different delays 42 and ANs 46 (shown as dashed lines in FIG. 2) process different signal components. Note also that, although not shown in FIG. 2, the model 36 may implement a recurrent ANN that uses feedback, e.g., from the output 48 of the model 36 or from the output of ANs 46 in a particular layer of the model 36.

Figure 3:
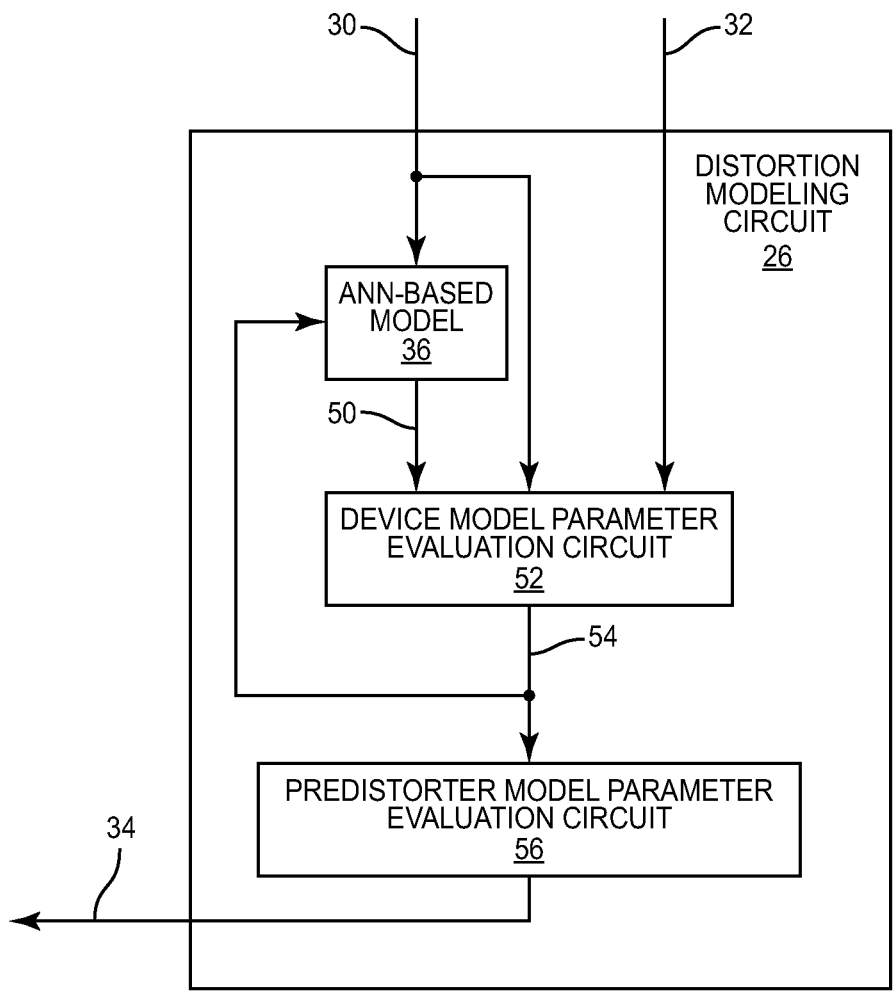
FIG. 3 is a block diagram of a distortion modeling circuit included in the predistortion circuit of FIG. 1 according to one or more embodiments.

The input 40 and output 48 of the model 36 depend on whether the model 36 models the device's distortion or models the predistorter's response. In embodiments where the model 36 models the device's distortion, the output 48 of the model corresponds to the estimated output of the device 12 and thus corresponds to the second signal samples 32 (i.e., the samples of the output signal 16 from the device). The input 40 to the model 36 in this case corresponds to the first signal samples 30 (i.e., the samples of the predistorted input signal 14B). FIG. 3 illustrates one example of these embodiments.

As shown in FIG. 3, the ANN-based model 36 receives the first signal samples 30 as input 40 and produces a signal 50 as output 48. If the ANN-based model 36 properly models the device's distortion, then the signal 50 produced by the model 36 as output 48 will exactly correspond to the second signal samples 32 (i.e., samples of the output signal 16 from the device 12). In this regard, a device distortion model parameter evaluation circuit 52 included in the distortion modelling circuit 26 compares signal 50 to the second signal samples 32 and calculates the parameters of the ANN-based model 36 that best fit the device's distortion (as directly observed based on the first and second signal samples 30, 32) to the model 36. Based on this calculation, the device distortion model parameter evaluation circuit 52 generates a control signal 54 that directs the ANN-based model 36 to adjust its parameters accordingly and that informs a predistorter model parameter evaluation circuit 56 of those parameters. The predistorter model parameter evaluation circuit 56 uses these parameters that model the device's distortion in order to determine the corresponding parameters for modelling the predistorter's response and to configure the predistorter 28 accordingly via control signal 34.

Figure 4:
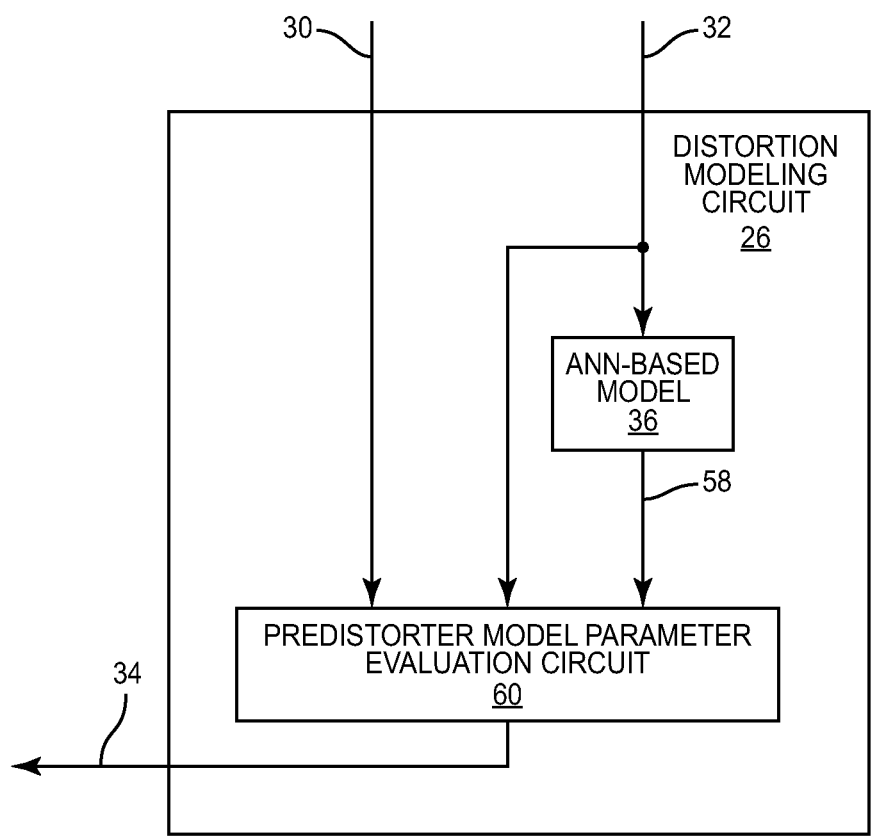
FIG. 4 is a block diagram of a distortion modeling circuit included in the predistortion circuit of FIG. 1 according to one or more other embodiments.

By contrast, in embodiments where the ANN-based model 36 models the predistorter's response to distortions introduced by the device 12, the output 48 of the model 36 corresponds to the desired output of the predistorter 28 and thus corresponds to the first signal samples 30 (i.e., samples of the predistorted input signal 14B). The input 40 to the model 36 in this case corresponds to the second signal samples 32 (i.e., samples of the output signal 16 from the device 12, which represent the input signal 14A plus any distortions introduced by the device 12). FIG. 4 illustrates one example of these embodiments.

As shown in FIG. 4, the ANN-based model 36 receives the second signal samples 32 as input 40 and produces a signal 58 as output 48. If the ANN-based model 36 models a response of the predistorter 28 that properly counteracts distortions introduced by the device 12, then the signal 58 produced by the model 36 as output 48 will contain fewer distortion products than those contained in the second signal samples 32 input to the model 36. In this regard, a predistorter model parameter evaluation circuit 60 included in the distortion modelling circuit 26 compares the signal 58 to the first signal samples 30 and calculates the parameters of the ANN-based model 36 that counteract the device's distortion. The predistorter model parameter evaluation circuit 60 then configures the predistorter 28 accordingly via control signal 34.

With this understanding, FIGS. 5A-D illustrate details of one embodiment where the ANN-based model 36 is structured as a feedforward multilayer perceptron network and where the input 40 and output 48 of the model 36 each have an in-phase component 40A, 48A ($I_{in}$, $I_{out}$) and a quadrature component 40B, 48B ($Q_{in}$, $Q_{out}$). The tapped delay line 38 of the ANN-based model 36 generates a non-delayed version of the input's in-phase component 40A as $I_{in}(n)$ and a non-delayed version of the input's quadrature component 40B as $Q_{in}(n)$ for a current sampling time instance n. The tapped delay line 38 also includes $P_1$ delays 42 that generate different delayed versions of the input's in-phase component 40A and includes $P_2$ delays 42 that generate different delayed versions of the input's quadrature component 40B.

Figure 5A:
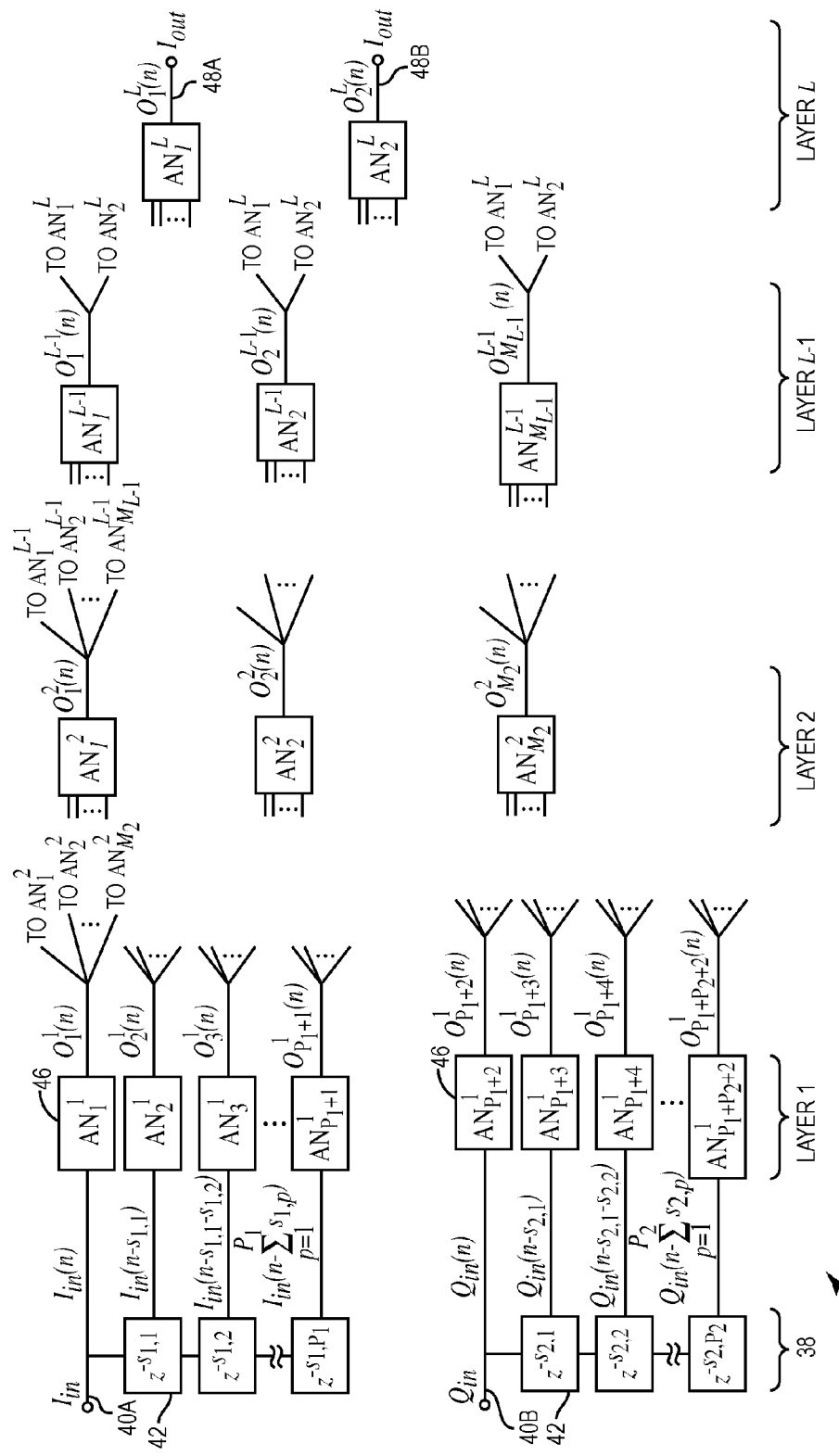
FIGS. 5A-5D are block diagrams illustrating details of an ANN-based model according to one or more embodiments where the model has a feedforward structure.

As shown in FIG. 5A, for example, a delay $z^{-s_{1,1}}$ delays the input's in-phase component $I_{in}$ with respect to the current sampling time instance n by $s_{1,1}$ sampling time instances (i.e., by $s_{1,1}$ unit delay intervals) in order to generate a delayed version $I_{in}(n-s_{1,1})$. Similarly, a delay $z^{-s_{1,2}}$ delays $I_{in}(n-s_{1,1})$ by an additional $s_{1,2}$ sampling time instances in order to generate delayed version $I_{in}(n-s_{1,1}-s_{1,2})$. This generation of delayed versions continues until finally a delay $$z^{-s_{1,P_1}}$$

imposes an additional delay of $s_{1,P_1}$ sampling time instances in order to generate delayed version $$I_{in}\left(n - \sum_{p=1}^{P_1} s_{1,p}\right).$$

Delays $z^{-s_{2,1}}$, $z^{-s_{2,2}}$, ... $z^{-s_{2,P_2}}$ similarly impose delays of $s_{2,1}$, $s_{2,2}$, ... $s_{2,P_2}$ sampling time instances in order to generate delayed versions $Q_{in}(n-s_{2,1})$, $Q_{in}(n-s_{2,1}-s_{2,2})$, ...

$$Q_{in}\left(n - \sum_{p=1}^{P_2} s_{2,p}\right).$$

Because the tapped delay line 36 includes a multi-unit delay interval between at least one pair of adjacent delays 46, at least one of the delays 46 imposes a delay of multiple sampling time instances, i.e., at least one of $s_{1,1}, s_{1,2}, \ldots, s_{2,P_2}$ is >1. In some embodiments, the delay intervals between different pairs of delays 46 are uniform, meaning that $s_{1,1}=s_{1,2}=\ldots s_{1,P_1}=s_{2,1}=s_{2,2}=\ldots s_{2,P_2}$. In other embodiments, though, the delay intervals between different pairs of delays 46 are non-uniform. For example, the value of $s_{1,p}$ may be different for different p (e.g., $s_{1,p}=1$ for p=1 and $s_{1,p}=4$ for p=$P_1$). The same may be said for the value of $S_{2,p}$. Irrespective of whether or not the delay intervals are uniform across different pairs of adjacent delays 46 in the tapped delay line 38, the multi-unit delay interval between at least one pair of adjacent delays 46 decreases correlation amongst the different versions of the input 40 and thus increases the stability with which the parameters of the ANN-based model 36 may be calculated. In at least some embodiments, these parameters include the weighting parameters and bias parameter for each of a plurality of artificial neurons 46.

Figure 5B:
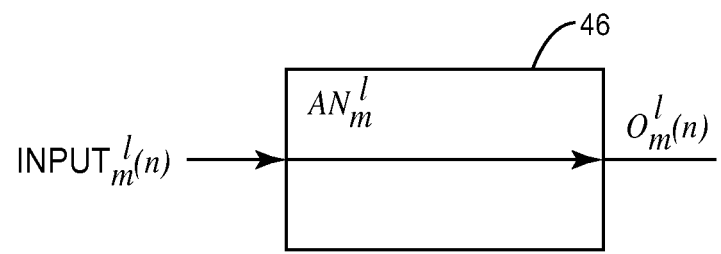

More particularly, the ANN-based model 36 as shown in FIG. 5A includes three or more layers L of artificial neurons (ANs) 46. A first layer of artificial neurons includes $P_1+1$ artificial neurons $AN_1^1, AN_2^1, AN_3^1, \ldots AN_{P_1+1}^1$ for processing the input's in-phase component 40A and $P_2+1$ artificial neurons $AN_{P_1+2}^1, AN_{P_1+3}^1, AN_{P_1+4}^1, \ldots AN_{P_1+P_2+2}^1$ for processing the input's quadrature component 40B, for a total of $M_1=P_1+P_2+2$ artificial neurons where the m-th artificial neuron in the l-th layer is denoted as $AN_m^l$ for $1 \leq l \leq L$ and $1 \leq m \leq M_1$. Each artificial neuron $AN_m^1$ in this first layer simply passes a respective version of the input 40 to a second layer of $M_2$ artificial neurons as output $O_m^1(n)$. In this regard, FIG. 5B illustrates an artificial neuron $AN_m^1$ in the first layer as simply a pass-through neuron, where $Input_m^1(n)$ corresponds to a respective version of the input 40 and $O_m^1(n)=Input_m^1(n)$ for $1 \leq m \leq M_1$.

Figure 5C:
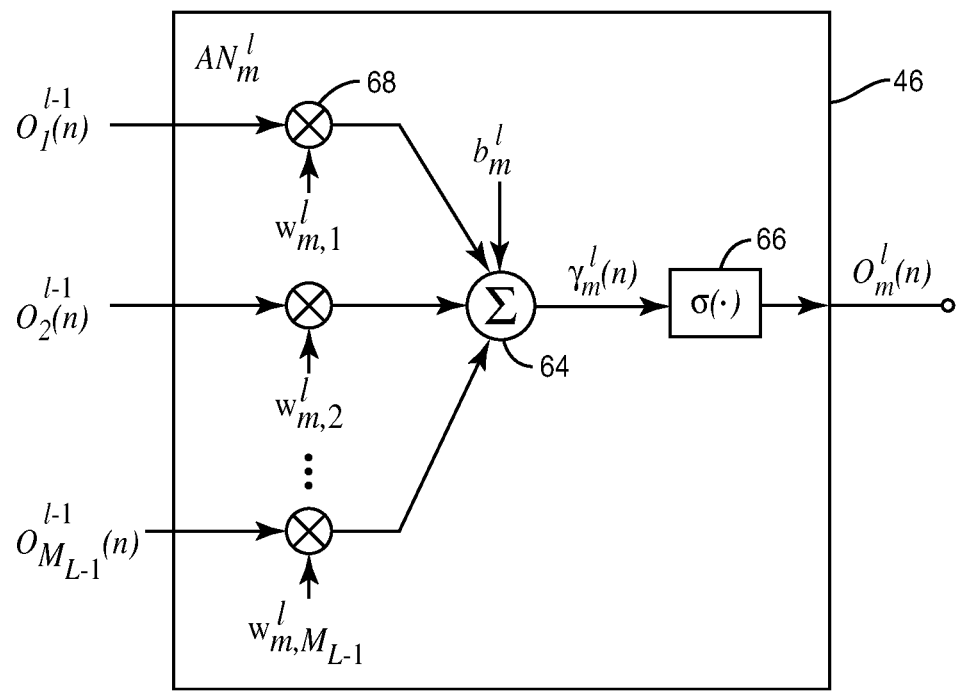

Any given neuron $AN_m^2$ in the second layer receives the output $O_m^1(n)$ from each neuron $AN_m^1$ in the first layer and then processes those outputs $O_m^1(n)$ according to weighting parameters $w_m^2$ and a bias parameter $b_m^2$ defined for that neuron $AN_m^2$ in order to generate an output $O_m^2(n)$. Any given neuron $AN_m^l$ in other layers (i.e., for $l \geq 2$) does the same, i.e., receives the output $O_m^{l-1}(n)$ from each neuron $AN_m^{l-1}$ in a previous l-1-th layer and processes those outputs $O_m^{l-1}(n)$ according to weighting parameters $w_m^l$ and a bias parameter $b_m^l$ defined for that neuron $AN_m^l$ in order to generate an output $O_m^l(n)$. FIG. 5C illustrates details in this regard.

As shown in FIG. 5C, a neuron $AN_m^l$ in the l-th layer (for $2 \leq l < L$) functionally includes a plurality of $M_{l-1}$ multipliers 62, one for each output from the l-1-th layer, a biased combiner 64, and an activator 66. Each multiplier 62 applies a weighting parameter $w_{m,j}^l$ to a respective output $O_j^{l-1}(n)$ from the l-1-th layer, where $1 \leq m \leq M_l$ and $1 \leq j \leq M_{l-1}$. The biased combiner 64 sums the output from the plurality of multipliers 62 and adds a bias parameter $b_m^l$ so as to bias or offset the weighted sum according to:

$$\gamma_m^l(n) = \sum_{j=1}^{M_{l-1}} w_{m,j}^l O_j^{l-1}(n) + b_m^l. \quad (1)$$

Finally, the activator 66 passes the weighted and biased sum $\gamma_m^l(n)$ through an activation function $\sigma(\cdot)$ to produce:

$$O_m^l(n) = \sigma(\Gamma_m^l(n)). \quad (2)$$

This activation function $\sigma(\cdot)$ is non-linear function and enables the ANN-based model 36 to model non-linear functions. Examples of the activation function $\sigma(\cdot)$ include the sigmoid function $$\sigma(y) = \frac{1}{1+e^{-y}},$$

the arctangent function $$\sigma(y) = \frac{1}{\pi}\tan^{-1}y,$$

and the hyperbolic tangent function $$\sigma(y) = \frac{e^y - e^{-y}}{e^y + e^{-y}}.$$

Figure 5D:
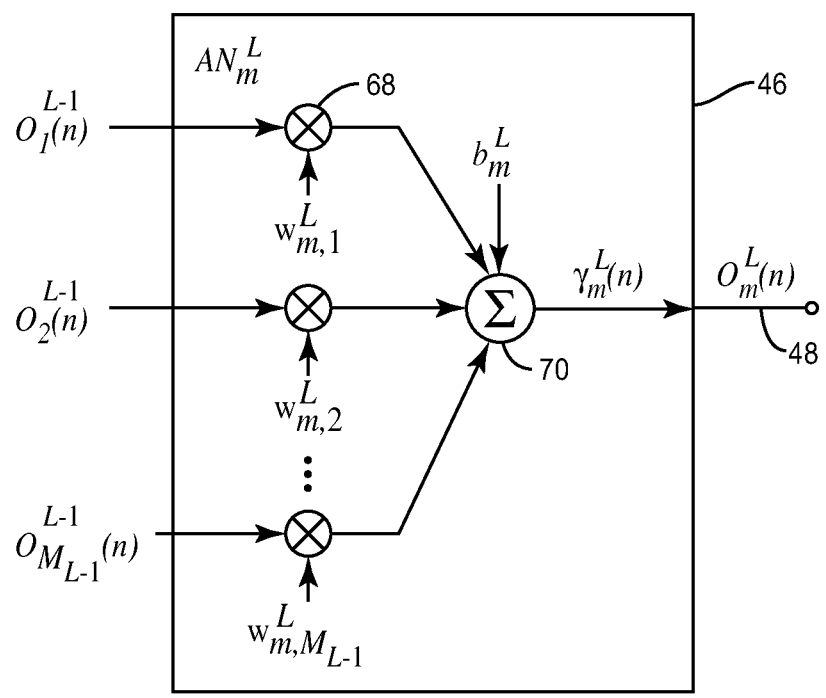

As shown in FIG. 5D, any given neuron $AN_m^L$ in the L-th layer also computes a weighted sum of the output $O_m^{L-1}(n)$ from each neuron $AN_m^{L-1}$ in the previous L-1-th layer according to weighting parameters $w_m^L$ and biases that weighted sum according to a bias parameter $b_m^L$. Indeed, such a neuron $AN_m^L$ also includes a plurality of $M_{L-1}$ multipliers 68, one for each output from the L-1-th layer, and a biased combiner 70. Rather than passing the weighted and biased sum $\gamma_m^L(n)$ through an activation function $\sigma(\cdot)$, however, the output $O_m^L(n)$ of the neuron $AN_m^L$ is simply the weighted and biased sum $\gamma_m^L(n)$. With the example of FIGS. 5A-5D including an output 48 that has two different components 48A and 48B, the L-th layer includes two neurons $AN_1^L$ and $AN_2^L$ that respectively generate output components 48A and 48B.

Those skilled in the art will appreciate that although FIGS. 5A-5D illustrate embodiments herein with the example of a feedforward network, the embodiments are not so limited. For example, embodiments herein equally apply to a recurrent network that uses feedback, e.g., from the output 48 of the model 36 or from the output of ANs 46 in a particular layer of the model 36.

Figure 6:
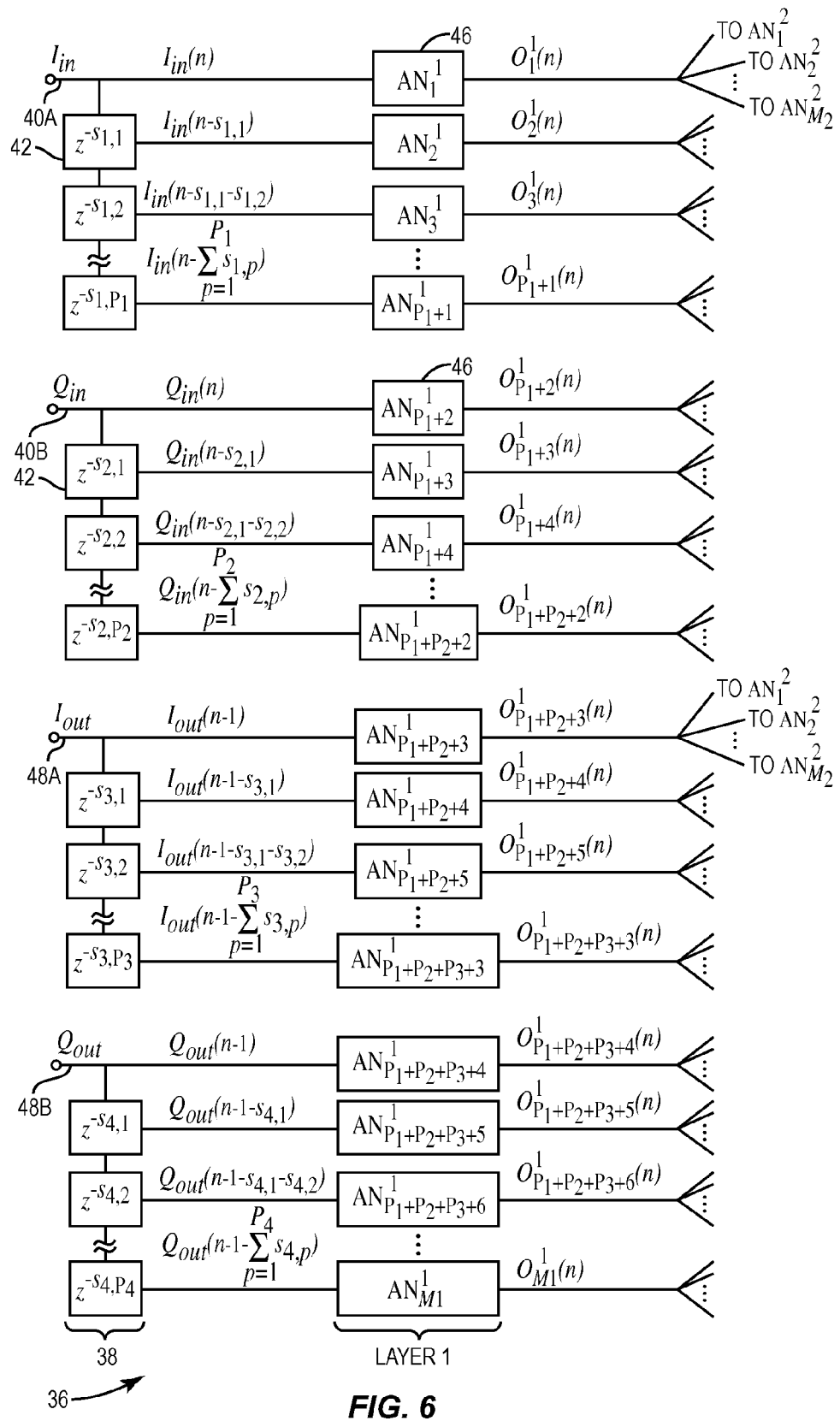
FIG. 6 is a block diagrams illustrating details of an ANN-based model according to one or more embodiments where the model has a recurrent structure.

FIG. 6 shows an example of this in the context of a simple extension of the embodiment in FIGS. 5A-5D. As depicted in FIG. 6, the output components 48A and 48B ($I_{out}$ and $Q_{out}$) are fed back to the tapped delay line 38. The tapped delay line 38 generates a non-delayed version of the output's in-phase component 48A as $I_{out}(n-1)$ and a non-delayed version of the output's quadrature component 48B as $Q_{out}(n-1)$ for a current sampling time instance n. The tapped delay line 38 also includes $P_3$ delays 42 that generate different delayed versions of the output's in-phase component 48A and includes $P_4$ delays 42 that generate different delayed versions of the output's quadrature component 48B.

In particular, a delay $z^{-s_{3,1}}$ delays the output's in-phase component $I_{out}$ by $s_{3,1}$ sampling time instances in order to generate a delayed version $I_{out}(n-1-s_{3,1})$. Similarly, a delay $z^{-s_{3,2}}$ delays $I_{out}(n-1-s_{3,1})$ by an additional $s_{3,2}$ sampling time instances in order to generate delayed version $I_{out}(n-1-s_{3,1}-s_{3,2})$. This generation of delayed versions continues until finally a delay $$z^{-s_{3,P_3}}$$

imposes an additional delay of $s_{3,P_3}$ sampling time instances in order to generate delayed version $$I_{out}\left(n-1-\sum_p^{P_3} s_{3,p}\right).$$

Delays $z^{-s_{4,1}}$, $$z^{-s_{4,2}}, \ldots z^{-s_{4,P_4}}$$

similarly impose delays of $s_{4,1}, s_{4,2}, \ldots s_{4,P_4}$ sampling time instances in order to generate delayed versions $Q_{out}(n-1-s_{4,1}), Q_{out}(n-1-s_{4,1}-s_{4,2}), \ldots$ $$Q_{out}\left(n-1-\sum_p^{P_4} s_{4,p}\right).$$

By extension of FIG. 5A-5D, therefore, at least one of the $P_1+P_2+P_3+P_4$ delays 42 imposes a delay of multiple sampling time instances, i.e., at least one of $s_{1,1}, s_{1,2}, \ldots s_{4,P_4}$ is greater than 1.

Regardless, as compared to FIG. 5A, the first layer includes $P_3+1$ additional artificial neurons $AN_{P_1+P_2+3}^1, AN_{P_1+P_2+4}^1, AN_{P_1+P_2+5}^1, \ldots AN_{P_1+P_2+P_3+3}^1$ for processing the output's in-phase component 48A and $P_4+1$ neurons $AN_{P_1+P_2+P_3+4}^1, AN_{P_1+P_2+P_3+5}^1, \ldots AN_{M_1}^1$ for processing the input's quadrature component 40B, for a total of $M_1=P_1+P_2+P_3+P_4+4$ artificial neurons. Each artificial neuron $AN_m^1$ in this first layer simply passes a respective version of the output 48 to the second layer of $M_2$ artificial neurons as output $O_m^1(n)$.

Those skilled in the art will appreciate that FIGS. 5A-5D and FIG. 6 just depict examples of embodiments herein and that the present invention is not so limited. For example, FIG. 6 depicts the tapped delay line 38 as including $P_1$ delays 42 applied to the input's in-phase component 40A, $P_2$ delays 42 applied to the input's quadrature component 40B, $P_3$ delays 42 applied to the feedback's in-phase component 48A, and $P_4$ delays 42 applied to the feedback's quadrature component 48B, where $P_1, P_2, P_3, P_4$ may be different. In at least some embodiments, though, the number of delays 42 applied to the input's components 40A, 40B and the feedback's components 48A, 48B may be identical, such that $P_1=P_2=P_3=P_4$.

As another example, although FIGS. 5A-5D and FIG. 6 depicts the input 40 and output 48 of the ANN-based model 36 as including components in a rectangular representation, those components may alternatively be in a polar representation (i.e., in magnitude/phase). Moreover, although the figures depict the input 40 and output 48 as being real, at least some embodiments herein contemplate a complex input 40 and output 48. Still further, although FIG. 6 shows the ANN-based model 36 as being a recurrent network with feedback taken from the output layer (i.e., Layer L), other embodiments herein include feedback being taken from one or more of the hidden layers (i.e., 2≤l≤L−1). And although FIG. 6 shows the ANN-based model as being a recurrent network with feedback going to the input layer (i.e., Layer 1), one or more other embodiments include feedback going to one or more of the hidden layers. Finally, although FIG. 6 illustrates the ANN-based model 36 as having a multilayer perceptron structure, the ANN-based model 36 according to other embodiments has any one of multiple different artificial neural network structures.

Those skilled in the art will also appreciate that, although various figures herein describe predistortion as being used to linearize the output of a power amplifier, the techniques described herein are more generally applicable to characterizing and/or compensating for distortion caused by any type of non-linear electronic device.

Further, those skilled in the art will appreciate that the predistortion circuit 18, and other circuits herein, may refer to a combination of analog and digital circuits, including one or more processors configured with software stored in memory and/or firmware stored in memory that, when executed by one or more processors, perform as described above. One or more of these processors, as well as the other digital hardware, may be included in a single application-specific integrated circuit (ASIC), or several processors and various digital hardware may be distributed among several separate components, whether individually packaged or assembled into a system-on-a-chip (SoC).

Figure 7:
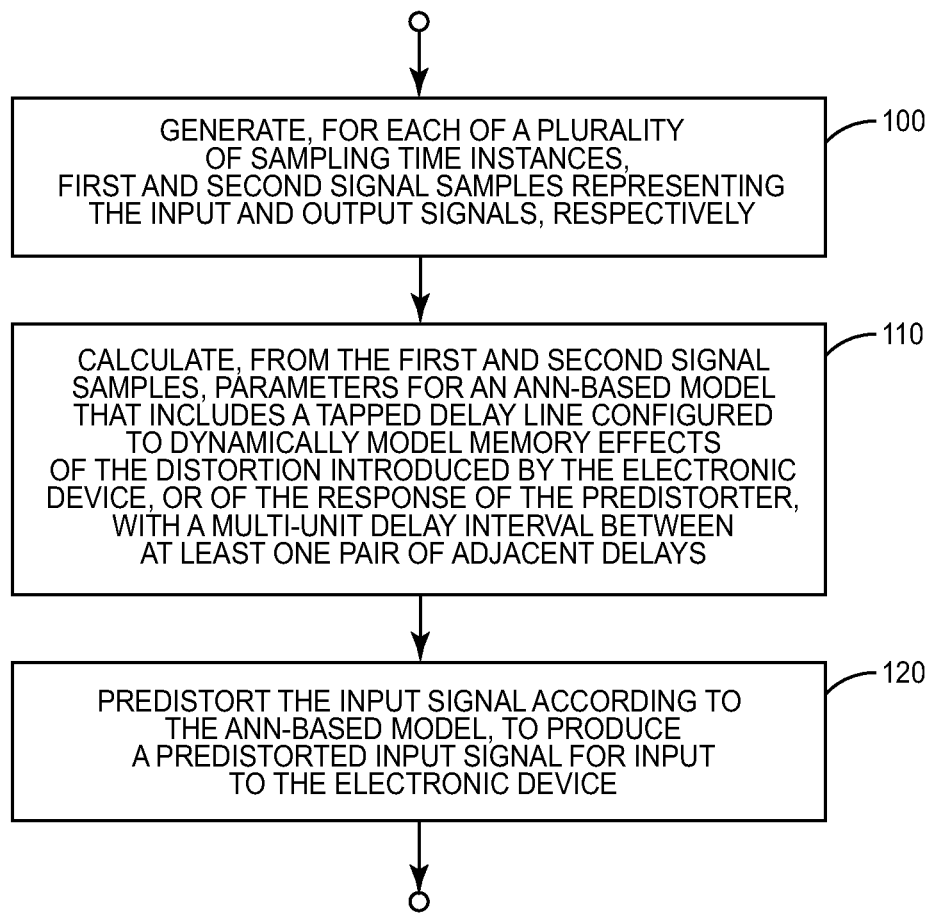
FIG. 7 is a logic flow diagram of processing performed by a predistortion circuit according to one or more embodiments.

In view of the variations and modifications described above, those skilled in the art will appreciate that the predistortion circuit 18 generally performs the processing shown in FIG. 7 for predistorting an input signal 14 at a predistorter 28 to compensate for distortion introduced by a non-linear electronic device 12 operating on the input signal 14 to produce an output signal 16. As shown in FIG. 7, processing at the predistortion circuit 18 includes generating, for each of a plurality of sampling time instances, first and second signal samples 30, 32 representing the input and output signals 14, 16, respectively (Block 100). In this regard, the first and second signal samples 30, 32 are spaced at unit-delay intervals, and each of the second signal samples 32 corresponds in time to one of the first signal samples 30. Processing at the predistortion circuit 18 further entails calculating, from the first and second signal samples 30, 32, parameters for an artificial neural network (ANN)-based model 36 that includes a tapped delay line 38 configured to dynamically model memory effects of the distortion introduced by the electronic device 12, or of the response of the predistorter 28, with a multi-unit delay interval between at least one pair of adjacent delays 42 (Block 110). Processing at the predistortion circuit 18 also includes predistorting the input signal 14 according to the ANN-based model 36, to produce a predistorted input signal 14B for input to the electronic device 12 (Block 120).

Figure 8:
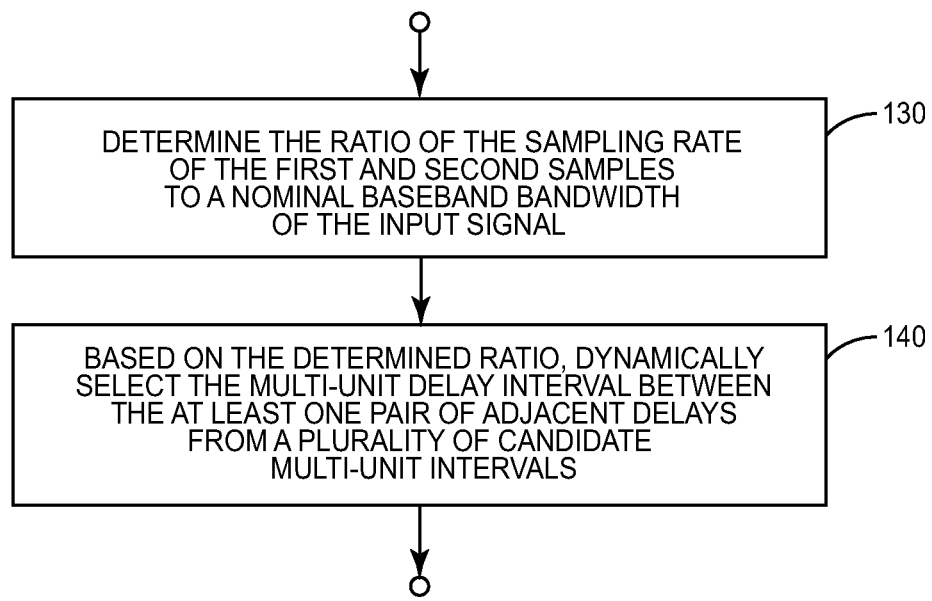
FIG. 8 is a logic flow diagram of additional processing performed by the predistortion circuit according to one or more embodiments.

Also in view of the variations and modifications above, those skilled in the art will appreciate that processing at the predistortion circuit 18 in at least some embodiments includes the additional processing shown in FIG. 8. As shown in FIG. 8, this processing entails determining the ratio of the sampling rate of the first and second samples 30, 32 to a nominal baseband bandwidth of the input signal 14 (Block 130). Processing further includes, based on the determined ratio, dynamically selecting the multi-unit delay interval between the at least one pair of adjacent delays 42 from a plurality of candidate multi-unit intervals (Block 140).

Those skilled in the art will recognize that the present invention may be carried out in other ways than those specifically set forth herein without departing from essential characteristics of the invention. The present embodiments are thus to be considered in all respects as illustrative and not restrictive, and all changes coming within the meaning and equivalency range of the appended claims are intended to be embraced therein.

What is claimed is:

1. A method for predistorting an input signal at a predistorter to compensate for distortion introduced by a non-linear electronic device operating on the input signal to produce an output signal, comprising:
generating, for each of a plurality of sampling time instances, first and second signal samples representing said input and output signals, respectively, wherein said first and second signal samples are spaced at unit-delay intervals and wherein each of the second signal samples corresponds in time to one of the first signal samples;
calculating, from the first and second signal samples, parameters for an artificial neural network (ANN)-based model that includes a tapped delay line configured to dynamically model memory effects of the distortion introduced by the electronic device, or of a response of the predistorter, with a multi-unit delay interval between at least one pair of adjacent delays, wherein the tapped delay line comprises a variable tapped delay line, and wherein the method further comprises dynamically selecting the multi-unit delay interval between the at least one pair of adjacent delays from a plurality of candidate multi-unit intervals, based on a ratio of the sampling rate of the first and second samples to a nominal baseband bandwidth of the input signal; and
predistorting the input signal according to the ANN-based model, to produce a predistorted input signal for input to the electronic device.

2. The method of claim 1, wherein the ANN-based model is configured to dynamically model the memory effects of the response of the predistorter, and wherein an input to the ANN-based model corresponds to the second signal samples and an output of the ANN-based model corresponds to the first signal samples, and wherein calculating the parameters from the first and second signal samples comprises directly estimating the parameters from the first and second signal samples.

3. The method of claim 1, wherein the ANN-based model is configured to dynamically model the memory effects of the distortion introduced by the electronic device, and wherein an input to the ANN-based model corresponds to the first signal samples and an output of the ANN-based model corresponds to the second signal samples.

4. The method of claim 1, wherein calculating parameters for the ANN-based model comprises calculating at least one of weighting parameters and bias parameters for artificial neurons in the ANN-based model.

5. The method of claim 1, wherein the multi-unit delay interval between the at least one pair of adjacent delays differs from a delay interval between at least one other pair of adjacent delays.

6. The method of claim 1, wherein the ANN-based model is configured to dynamically model said memory effects with the same multi-unit delay interval between each pair of adjacent delays.

7. The method of claim 6, wherein the method further comprises dynamically selecting said same multi-unit delay interval from a plurality of candidate multi-unit intervals, based on the ratio of the sampling rate of the first and second samples to the nominal baseband bandwidth of the input signal.

8. The method of claim 1, wherein the electronic device comprises a power amplifier in a wireless transmitter circuit.

9. A predistortion circuit for predistorting an input signal to compensate for distortion introduced by a non-linear electronic device operating on the input signal to produce an output signal, the predistortion circuit comprising:
- a sampling circuit configured to generate, for each of a plurality of sampling time instances, first and second signal samples representing said input and output signals, respectively, wherein said first and second signal samples are spaced at unit-delay intervals and wherein each of the second signal samples corresponds in time to one of the first signal samples;
- a distortion modeling circuit configured to calculate, from the first and second signal samples, parameters for an artificial neural network (ANN)-based model that includes a tapped delay line configured to dynamically model memory effects of the distortion introduced by the electronic device, or of a response of the predistorter, with a multi-unit delay interval between at least one pair of adjacent delays, wherein the tapped delay line comprises a variable tapped delay line, and
- wherein the distortion modeling circuit is further configured to dynamically select the multi-unit delay interval between the at least one pair of adjacent delays from a plurality of candidate multi-unit intervals, based on a ratio of the sampling rate of the first and second samples to a nominal baseband bandwidth of the input signal; and
- a predistorter configured to predistort the input signal according to the ANN-based model, to produce a predistorted input signal for input to the electronic device.

10. The predistortion circuit of claim 9, wherein the ANN-based model is configured to dynamically model the memory effects of the response of the predistorter, and wherein the second signal samples are an input to the ANN-based model and the first signal samples are the output of the ANN-based model, and wherein the distortion modeling circuit is configured to calculate the parameters from the first and second signal samples by directly estimating the parameters from the first and second signal samples.

11. The predistortion circuit of claim 9, wherein the ANN-based model is configured to dynamically model the memory effects of the distortion introduced by the electronic device, and wherein the first signal samples are an input to the ANN-based model and the second signal samples are an output of the ANN-based model.

12. The predistortion circuit of claim 9, wherein the distortion modeling circuit is configured to calculate the parameters from the first and second signal samples by calculating at least one of weighting parameters and bias parameters for artificial neurons in the ANN-based model.

13. The predistortion circuit of claim 9, wherein the multi-unit delay interval between the at least one pair of adjacent delays differs from a delay interval between at least one other pair of adjacent delays.

14. The predistortion circuit of claim 9, wherein the ANN-based model is configured to dynamically model said memory effects with the same multi-unit delay interval between each pair of adjacent delays.

15. The predistortion circuit of claim 14, wherein the distortion modeling circuit is further configured to dynamically select said same multi-unit delay interval from a plurality of candidate multi-unit intervals, based on the ratio of the sampling rate of the first and second samples to the nominal baseband bandwidth of the input signal.

16. The predistortion circuit of claim 9, wherein the electronic device comprises a power amplifier in a wireless transmitter circuit.

17. A method for predistorting an input signal at a predistorter to compensate for distortion introduced by a non-linear electronic device operating on the input signal to produce an output signal, comprising:
- generating, for each of a plurality of sampling time instances, first and second signal samples representing said input and output signals, respectively, wherein said first and second signal samples are spaced at unit-delay intervals and wherein each of the second signal samples corresponds in time to one of the first signal samples;
- calculating, from the first and second signal samples, parameters for an artificial neural network (ANN)-based model that includes a tapped delay line configured to dynamically model memory effects of the distortion introduced by the electronic device, or of a response of the predistorter, with a multi-unit delay interval between at least one pair of adjacent delays, wherein the ANN-based model is configured to dynamically model those of said memory effects that occur over a first term with a first delay interval between each of one or more first pairs of adjacent delays, and to dynamically model those of said memory effects that occur over a second term with a second delay interval between each of one or more second pairs of adjacent delays, wherein the first term differs from the second term, and wherein the first delay interval differs from the second delay interval, wherein the first term is shorter than the second term, wherein the one or more second pairs of delays follow the one or more first pairs of delays in the tapped delay line, wherein the first delay interval comprises a unit delay interval, and wherein the second delay interval comprises a multi-unit delay interval; and
- predistorting the input signal according to the ANN-based model, to produce a predistorted input signal for input to the electronic device.

18. A predistortion circuit for predistorting an input signal to compensate for distortion introduced by a non-linear electronic device operating on the input signal to produce an output signal, the predistortion circuit comprising:
- a sampling circuit configured to generate, for each of a plurality of sampling time instances, first and second signal samples representing said input and output signals, respectively, wherein said first and second signal samples are spaced at unit-delay intervals and wherein each of the second signal samples corresponds in time to one of the first signal samples;
- a distortion modeling circuit configured to calculate, from the first and second signal samples, parameters for an artificial neural network (ANN)-based model that includes a tapped delay line configured to dynamically model memory effects of the distortion introduced by the electronic device, or of a response of the predistorter, with a multi-unit delay interval between at least one pair of adjacent delays, wherein the ANN-based model is configured to dynamically model those of said memory effects that occur over a first term with a first delay interval between each of one or more first pairs of adjacent delays, and to dynamically model those of said memory effects that occur over a second term with a second delay interval between each of one or more second pairs of adjacent delays, wherein the first term differs from the second term, and wherein the first delay interval differs from the second delay interval, wherein the first term is shorter than the second term, wherein the one or more second pairs of delays follow the one or more first pairs of delays in the tapped delay line, wherein the first delay interval comprises a unit delay interval, and wherein the second delay interval comprises a multi-unit delay interval; and
a predistorter configured to predistort the input signal according to the ANN-based model, to produce a predistorted input signal for input to the electronic device.

* * * * *

UNITED STATES PATENT AND TRADEMARK OFFICE
CERTIFICATE OF CORRECTION

PATENT NO. : 8,976,893 B2
APPLICATION NO. : 13/547883
DATED : March 10, 2015
INVENTOR(S) : Bai It is certified that error appears in the above-identified patent and that said Letters Patent is hereby corrected as shown below:

Specification

In Column 4, Line 52, delete "circuit 36." and insert -- circuit 26. --, therefor.

In Column 7, Line 35, delete "$Z^{-S}_{1,1}$" and insert -- $Z^{-S_{1,1}}$ --, therefor.

In Column 7, Line 57, delete "$Z^{-S}_{2,1}, Z^{-S}_{2,2}, \ldots Z^{-S}_{2,P2}$" and insert -- $Z^{-S_{2,1}}, Z^{-S_{2,2}}, \ldots Z^{-S_{2,P2}}$ --, therefor.

In Column 7, Line 66, delete "line 36" and insert -- line 38 --, therefor.

In Column 8, Line 67, delete "$O_m^l(n)=\sigma(\Gamma_m^l(n)).$" and insert -- $O_m^l(n) = \sigma(\gamma_m^l(n)).$ --, therefor.

Signed and Sealed this
Twenty-eighth Day of June, 2016

Michelle K. Lee
*Director of the United States Patent and Trademark Office*